(12) United States Patent
Balszunat et al.

(10) Patent No.: US 6,822,865 B2
(45) Date of Patent: Nov. 23, 2004

(54) COOLING DEVICE FOR SEMICONDUCTOR MODULES

(75) Inventors: Dirk Balszunat, Tuebingen (DE); Reinhard Milich, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/464,143

(22) Filed: Jun. 18, 2003

(65) Prior Publication Data

US 2004/0066629 A1 Apr. 8, 2004

(30) Foreign Application Priority Data

Jun. 18, 2002 (DE) .......................... 102 27 008

(51) Int. Cl.[7] .................................. H05K 7/02
(52) U.S. Cl. .................. 361/699; 361/711; 257/714; 165/80.4
(58) Field of Search ................ 361/699, 704, 361/707, 709–711, 715–720; 257/706, 714; 174/15.2; 165/80.4

(56) References Cited

U.S. PATENT DOCUMENTS

| | | | |
|---|---|---|---|
| 3,768,548 A | 10/1973 | Dilay et al. | |
| 5,001,548 A | 3/1991 | Iversen | |
| 5,365,400 A | 11/1994 | Ashiwake et al. | |
| 5,635,757 A * | 6/1997 | Stockmeier et al. | 257/691 |
| 6,213,195 B1 * | 4/2001 | Downing et al. | 165/80.4 |
| 6,236,566 B1 * | 5/2001 | Regnier et al. | 361/699 |
| 6,388,317 B1 * | 5/2002 | Reese | 257/713 |
| 6,442,023 B2 * | 8/2002 | Cettour-Rose et al. | 361/690 |
| 6,529,394 B1 * | 3/2003 | Joseph et al. | 363/141 |
| 6,588,647 B2 * | 7/2003 | Yamada et al. | 228/112.1 |

FOREIGN PATENT DOCUMENTS

| | | | | |
|---|---|---|---|---|
| EP | 563679 | | 10/1993 | |
| EP | 767601 | | 4/1997 | |
| JP | 4-230065 | | 8/1992 | |
| JP | 05082687 A | * | 4/1993 | ........... H01L/23/40 |
| JP | 5-152476 | | 6/1993 | |
| JP | 5-235211 | | 9/1993 | |

* cited by examiner

Primary Examiner—Boris Chervinsky
(74) Attorney, Agent, or Firm—Kenyon & Kenyon

(57) ABSTRACT

A cooling device for semiconductor modules having: a cooler bar for accommodating at least one, particularly actively cooled semiconductor module; at least one first channel, particularly a bore hole, in the cooler bar for the passage of a, in particular, liquid coolant; and at least one second channel, particularly a bore hole, in the cooler bar for the feeding and/or return of the coolant to/from the semiconductor module.

19 Claims, 4 Drawing Sheets

US 6,822,865 B2

COOLING DEVICE FOR SEMICONDUCTOR MODULES

FIELD OF THE INVENTION

The present invention relates to a cooling device for semiconductor modules.

BACKGROUND INFORMATION

Semiconductor modules such as IGBTs, GTOs, IGCTs tend toward ever higher switching capacities or blocking voltages and forward currents, and are operated primarily in the pulse control operation of self-commutated converters like, for example, a pulse-controlled inverter, at increasingly higher switching frequencies. However, since the switching losses are essentially a function of these quantities, it is necessary to resort to suitable measures for cooling the modules, in order to carry away as efficiently as possible the dissipation power arising.

Present liquid-cooled pulse-controlled inverters have a base plate, through which a cooling medium flows, and the power semiconductors are mounted on it, for example, by screwing on, clamping or cementing. The power semiconductor modules are usually cooled on the lower side, where as a rule they have a flat, metallic surface. To improve the thermal tie between this lower side and the upper side of the actively cooled base plate which is likewise as flat as possible, heat-conductive paste, heat-conductive foil or heat-conductive adhesive agent is partially used. To provide the best possible thermal contact between the heat source (switching element) and the heat sink (base plate traversed by flow), the switching elements are often pressed with great force on the base plate. The limited thermal conductivity of these materials represents the greatest thermal resistance in the heat path from the power semiconductor to the cooling medium. The expenditure for assembly is considerable because of the introduction, for example, of the heat-conductive paste between the semiconductor module and the base plate, and the necessary pressure connection of the module to the plate.

SUMMARY OF THE INVENTION

Compared to the known design approach, the cooling device of the present invention for semiconductor modules has the advantage that the thermal properties of, in particular, actively cooled semiconductor modules are improved, and in addition, a simpler, more compact and more cost-effective construction, particularly of pulse-controlled inverters, is made possible.

The idea underlying the present invention is based essentially on the use of a cooler bar in connection with actively cooled high-current modules, instead of a cooled base plate with power semiconductors to be cooled in a planar fashion.

In the present invention, the problem mentioned at the outset is solved in particular in that a cooler bar accommodates at least one semiconductor module and has a plurality of bore holes or channels for conducting a, in particular, liquid coolant to and from the semiconductor module, through which the coolant flows directly.

According to one preferred refinement, the coolant is able to be supplied to or conducted away from at least two semiconductor modules in parallel via supply channels and/or return channels of the cooler bar. This brings the advantage of being able to cool units having a plurality of modules concurrently.

According to a further preferred refinement, the coolant is able to be supplied to or carried away from at least two semiconductor modules in series via supply channels and/or return channels, the coolant being able to be conducted via the cooler bar from one semiconductor module to an additionally mounted semiconductor module. This brings the advantage of being able to cool units having a plurality of modules sequentially.

In a further preferred embodiment, the cooler bar essentially has a metal, particularly aluminum, with the advantage that the bar is easy to process and possesses good thermal conductivity.

According to a further preferred development, the cooler bar has at least one fixing device for securing one or more semiconductor modules, from which are yielded advantageous securing possibilities.

In another preferred refinement, the device has a sealing element, particularly O-rings, for sealing between the channels of the cooler bar and the semiconductor module(s), to ensure an advantageous leakage-free interface.

In a further preferred refinement, the, in particular, liquid coolant essentially has water or demineralized water. This brings the advantage that the coolant can be handled easily and without problems, as well as low costs.

In a further preferred development, the cooler bar essentially forms a support structure, by which the semiconductor modules are able to be interconnected and/or the cooling device is able to be secured, it thereby being advantageously possible to dispense with additional support structures.

According to another preferred embodiment, the cooler bar has further components, such as structural elements, electric lines, sensors or a control, in order to utilize the advantage of a compact configuration.

In a further preferred refinement, the cooler bar has semiconductor modules on several sides of the cooler bar, in order to utilize the advantage of a compact configuration.

Exemplary embodiments of the present invention are represented in the drawing and are explained in greater detail in the following description.

DETAILED DESCRIPTION

Figure 1:
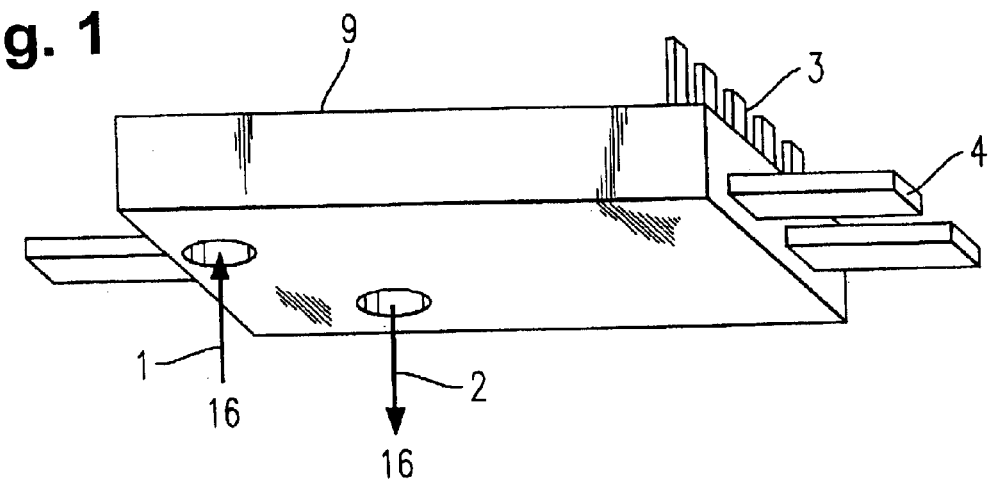
FIG. 1 shows the schematic view of an actively cooled semiconductor module.

In the figures, the same reference numerals denote the same or functionally equivalent component parts.

Description of the Exemplary Embodiments

FIG. 1 shows the schematic view of a semiconductor module.

FIG. 1 shows an actively cooled semiconductor module 9 which has at least one supply 1, i.e. a supply opening, for bringing in a, in particular, liquid coolant 16, and at least one return 2, i.e. a return opening, for carrying away coolant 16 that is made, for example, essentially of water or demineralized water. Semiconductor module 9 is controllable via control-current terminals 3, and has power terminals 4. A semiconductor module of this type is, for example, an IGBT.

Figure 2:
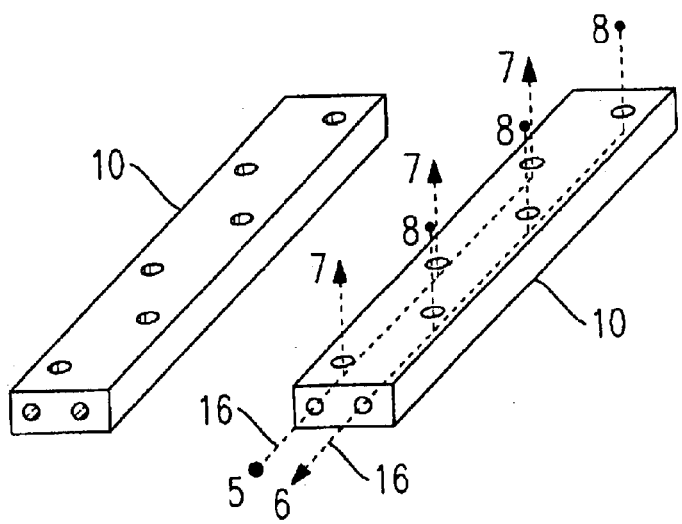
FIG. 2 shows the schematic view of a cooler bar.

FIG. 2 shows the schematic view of two cooler bars.

FIG. 2 depicts two cooler bars 10, i.e. cooler rails 10, particularly for the parallel supply/draining of a coolant 16, the cooler rail being a bar-type block made, for example, of extruded aluminum. Two long channels 5, 6, particularly bore holes for the coolant inlet and outlet are introduced into the cooler rails. Another possibility for forming the channels is to provide two cavities in an aluminum profile. In each case one side of the cavity opening may be closed, and the other opening used as inlet and outlet, respectively. On the mounting side of cooler rail 10 toward modules 9, further channels 7, 8, particularly bore holes, up to the two long inlet and outlet channels/bore holes 5, 6 provide for the respective supply of the at least one module 9 with coolant 16. The cooling device is provided with actively cooled power modules 9, thus power modules through which coolant 16 flows. The sealing between cooler rail 10 and switching module 9 may be implemented by a sealing device, particularly O-rings. Cooler rail 10 has one or more fixing devices (not shown) for mounting power modules 9 on cooler rail 10, and the interconnection may be effected by screwing, clamping, adhesion or clipping.

In addition to the mechanical fixing elements for modules 9 per se, cooler bar 10 may also have fixing devices for further components 14, 15. Fixing devices may be tapped holes, edges and fixing angles for sliding components 14, 15 onto rail 10. The use of sliders (not shown), which may be slid onto rail 10 for mounting, is possible.

Figure 3:
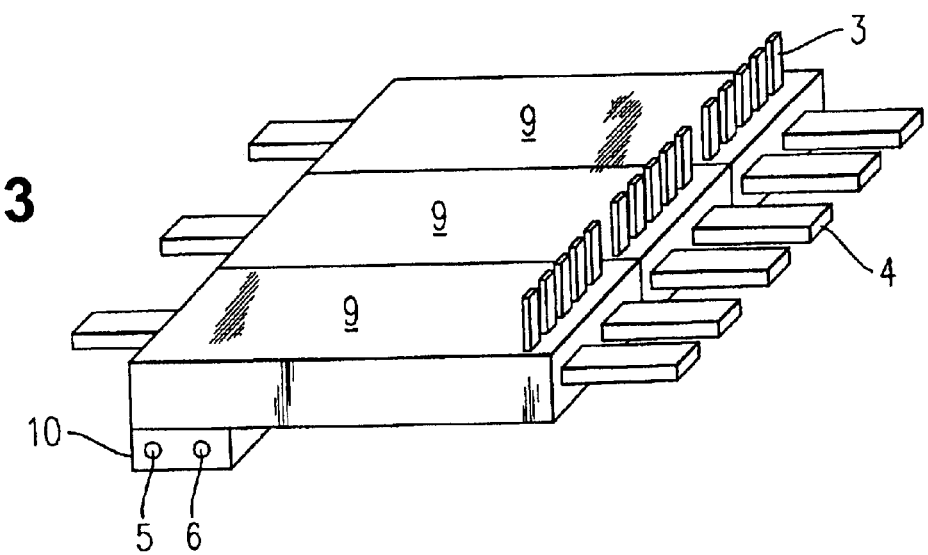
FIG. 3 shows the schematic view of a cooling device for clarifying a first specific embodiment of the present invention.

FIG. 3 shows the schematic view of a cooling device for clarifying a first specific embodiment of the present invention.

FIG. 3 shows a cooler rail 10 essentially according to FIG. 2, which has a coolant supply channel 5 and a coolant return channel 6, and to which three semiconductor modules 9 are secured and through which coolant 16 flows via coolant paths 5, 6, 7, 8 according to FIG. 2.

Figure 4:
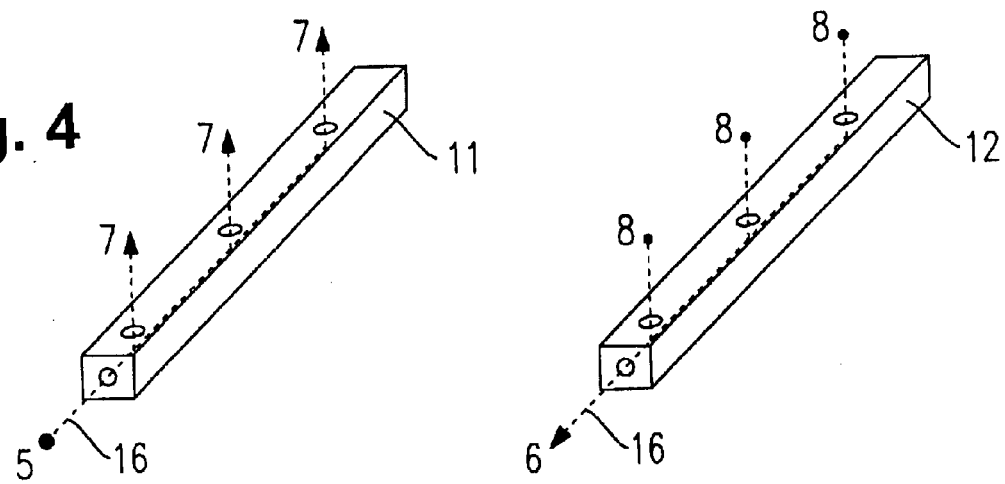
FIG. 4 shows the schematic view of two cooler bars.

FIG. 4 shows the schematic view of two cooler bars.

FIG. 4 shows a supply or inlet cooler bar 11 in which coolant 16 is able to be supplied via a long channel 5 and feed channels 7 to one or more semiconductor modules 9. Reference numeral 12, on the other hand, designates a return or outlet cooler bar 12 which has at least one return channel 8 and one return channel 6 in the longitudinal direction for carrying away coolant 16 from semiconductor modules 9.

Figure 5:
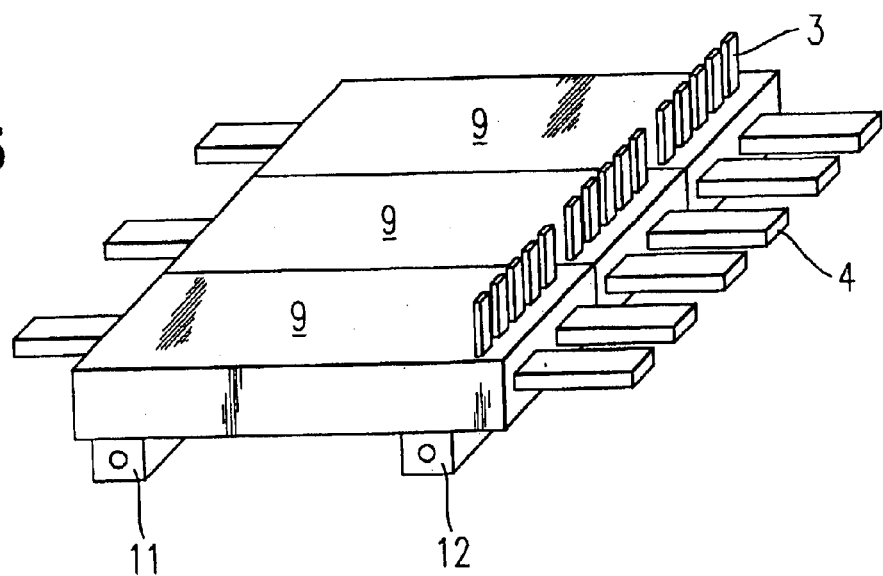
FIG. 5 shows the schematic view of a cooling device for clarifying a second specific embodiment of the present invention.

FIG. 5 shows the schematic view of a cooling device for clarifying a second specific embodiment of the present invention.

FIG. 5 shows three actively cooled semiconductor modules 9 interconnected via a separate supply cooler bar 11 and return cooler bar 12. Coolant 16 is conveyed for heat absorption to modules 9 via supply bar 11, flows through parts of modules 9, and is then conveyed via return cooler bar 12 to an external heat exchanger device (not shown).

Figure 6:
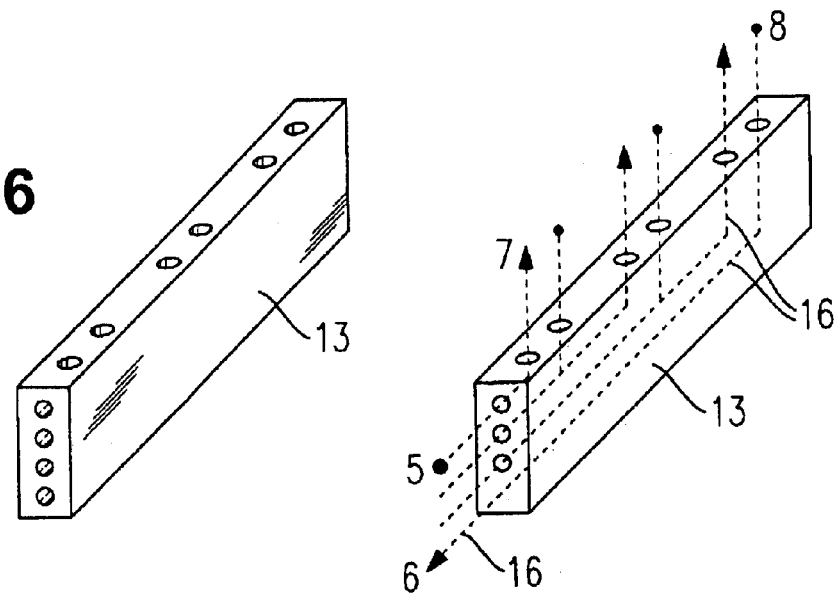
FIG. 6 shows the schematic view of second cooler bars.

FIG. 6 shows the schematic view of second cooler bars.

FIG. 6 shows two cooler rails 13, particularly for the feeding of coolant 16 in series. Coolant 16 is conveyed through coolant supply channel 5 and channel 7 to a first semiconductor module 9, flows through it, is then conveyed to a further coolant channel in cooler bar 13, to subsequently flow through following semiconductor module 9 ... until the coolant is able to leave the device again via return channel 8 and coolant return channel 6.

Figure 7:
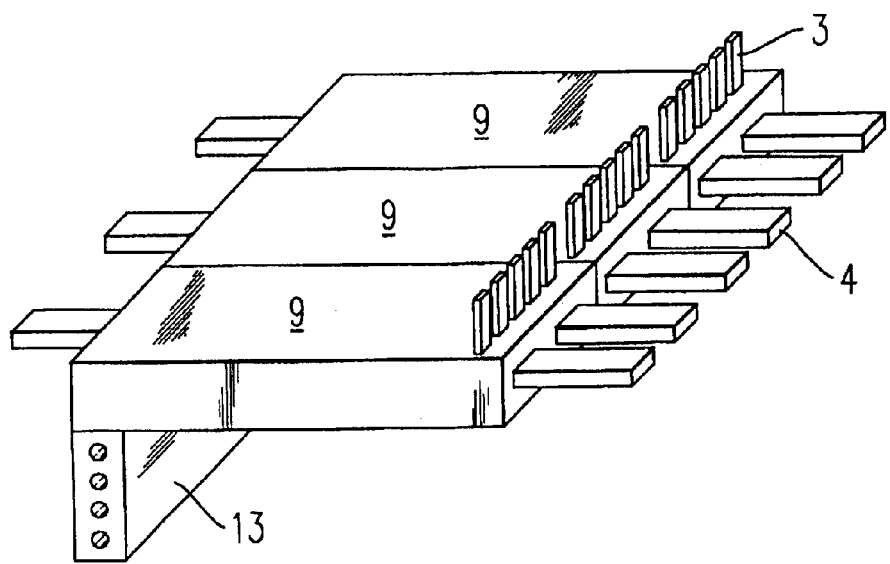
FIG. 7 shows the schematic view of a cooling device for clarifying a third specific embodiment of the present invention.

FIG. 7 shows the schematic view of a cooling device for clarifying a third specific embodiment of the present invention.

In FIG. 7, cooler bar 13 having coolant inlet and outlet in series according to FIG. 6 is connected to three semiconductor modules 9 for their cooling.

Figure 8:
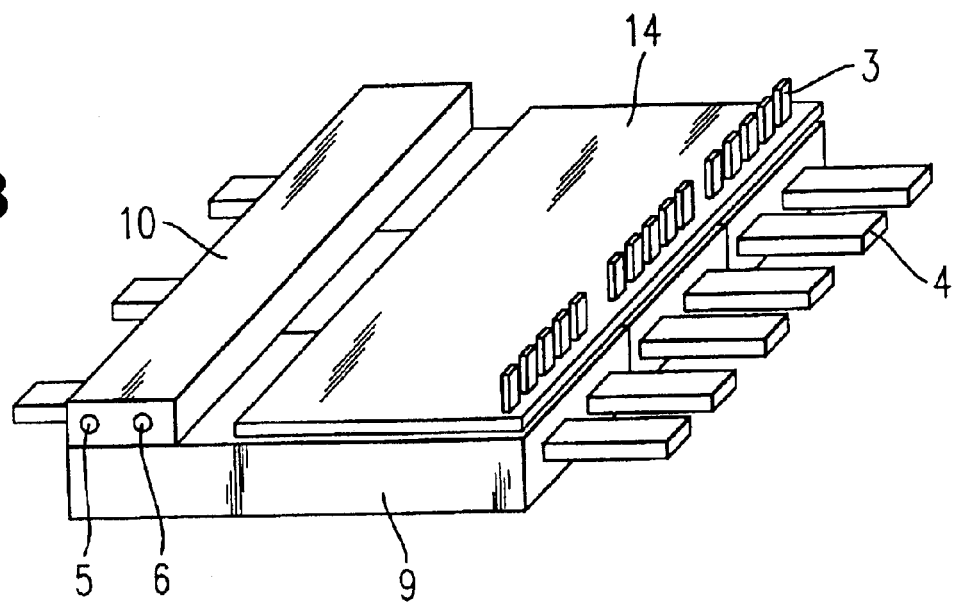
FIG. 8 shows the schematic view of a cooling device for clarifying a fourth specific embodiment of the present invention.

FIG. 8 shows the schematic view of a cooling device for clarifying a fourth specific embodiment of the present invention.

In FIG. 8, three switching modules 9 are interconnected via cooler bar 10 according to FIG. 2. Cooler rail 10 is on the top side of modules 9, where likewise a control board 14 is provided, particularly for controlling modules 9, in order to create a compact design.

Figure 9:
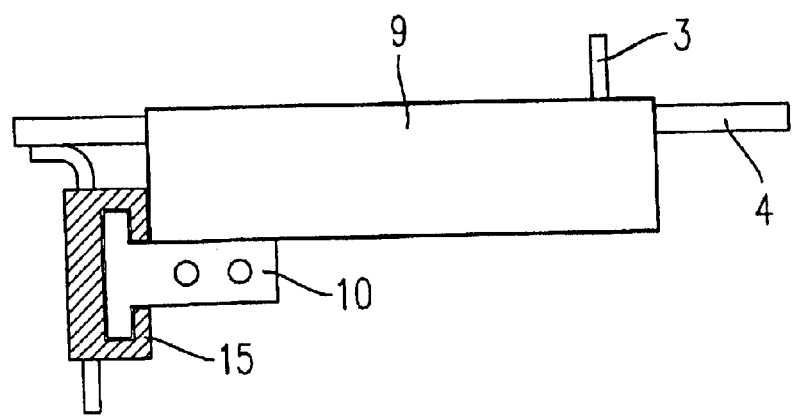
FIG. 9 shows the schematic view of a cooling device for clarifying a fifth specific embodiment of the present invention.

FIG. 9 shows the schematic view of a cooling device for clarifying a fifth specific embodiment of the present invention.

FIG. 9 shows a switching module 9 joined to a cooler rail 10 that has a T-shape to permit the securing of further elements such as a molded punched grid for the electrical interconnection and/or a bus bar 15.

In principle, the possibility exists of supplying coolant 16 to modules 9 connected in parallel or in series with respect to the coolant circuit. Both, and also a combination thereof, such as two modules in parallel and one in series thereto, may be implemented by the selection of the arrangement of channels or bore holes with a cooler rail 10, 11, 12, 13. In addition, modules 9 may be positioned on several sides of the rail.

A cooler rail 10, 11, 12, 13 may fulfill further functions at the same time; for example, if one bore hole branches into a plurality of bore holes coming from the side, it may be used as a coolant distributor. The distribution ratio of the coolant, and thus the possible cooling, is determined substantially by coolant 16, its flow velocity, and by the diameters of the channels and the outgoing bore holes, respectively. The use of filters is possible.

A cooler bar 10, 11, 12, 13 may additionally be used as a support for further elements 14, 15 which are fixed in position on the rail by sliding on or mounting using, for example, claw-fixation elements.

The thermal resistance between the module to be cooled and the heat-dissipation device is considerably reduced by the use of a cooler bar according to the present invention. For example, in this way the pulse-controlled inverter may be dimensioned, and therefore produced smaller and more cost-effectively. Silicon area of the power components and the area of the power substrate may be markedly reduced, since because of the better cooling, it can be utilized to greater capacity.

The expenditure for assembly is perceptibly reduced, inter alia, by the omission of the heat-conductive paste or something similar, and the assembly reliability is improved, since the thermal resistance of a flat connection using paste, adhesive or foil would be dependent on the layer thickness, taper, freedom from shrink holes, and thus on the quality of the assembly.

The entire assembly of a, for example, pulse-controlled inverter may also be implemented in a more compact fashion due to the fact that the cooler rail may assume further functions, e.g., as a support for further structural elements, components, lines, sensors or a control.

Although the present invention is described above on the basis of preferred exemplary embodiments, it is not limited to them, and may be modified in numerous ways.

Even if semiconductor modules having only one inlet and outlet, respectively, for the active cooling of the module are shown in the exemplary embodiments, a plurality of inlets and outlets is conceivable; other geometries of the cooler bars and/or the semiconductor modules are also conceivable. Sealing devices such as adapted pins, adhesive elements or the like are possible for closing or sealing the channel pieces of a cooler rail for the sequential coolant flow-through according to FIG. 6, the channel pieces being needed in particular only for the fabrication.

The present invention is also not limited to the application possibilities indicated, such as use in a pulse-controlled inverter.

Reference Numeral List 1 inlet for the coolant on the semiconductor module
2 outlet for the coolant on the semiconductor module
3 control-current terminals of the semiconductor module
4 power terminals of the semiconductor module
5 supply of the coolant, particularly via a bore hole
6 return of the coolant, particularly via a bore hole
7 feed to a semiconductor module (e.g. bore hole)
8 return from a semiconductor module (e.g. bore hole)
9 semiconductor module, particularly a switching device
10 cooler bar (cooler rail), particularly for feeding in parallel
11 inlet cooler bar (inlet rail)
12 outlet cooler bar (outlet rail)
13 cooler bar (cooler rail), particularly for feeding in series
14 control board
15 molded punched grid as electrical interconnection and/or bus bar
16 coolant, particularly liquid (e.g. water)

What is claimed is:

1. A cooling device for at least one semiconductor module, comprising:
   a cooler bar arrangement for accommodating the at least one semiconductor module, wherein the at least one semiconductor module includes a coolant supply opening for receiving a liquid coolant and a coolant return opening for returning the liquid coolant, the cooler bar arrangement including:
   at least one first channel running along the cooler bar arrangement, wherein the first channel includes at least one supply feed, the supply feed being arranged essentially perpendicular to the first channel, and wherein the supply feed is to be aligned with the coolant supply opening of the at least one semiconductor module; and
   at least one second channel running along the cooler bar arrangement, wherein the second channel includes at least one return feed, the return feed being arranged essentially perpendicular to the second channel, wherein the return feed is to be aligned with the coolant return opening of the at least one semiconductor module, and wherein the first channel and the second channel are arranged to be essentially parallel to each other.

2. The cooling device as recited in claim 1, wherein:
   the at least one semiconductor module includes at least two semiconductor modules, and
   the liquid coolant is able to be one of supplied to and carried away from the at least two semiconductor modules in parallel via at least one of a supply channel and a return channel of the cooler bar arrangement, wherein the supply channel and the return channel are provided by the first and second channels.

3. The cooling device as recited in claim 1, wherein:
   the at least one semiconductor module includes at least two semiconductor modules,
   the liquid coolant is able to be one of supplied to and carried away from the at least two semiconductor modules in series via at least one of a supply channel and a return channel of the cooler bar arrangement, wherein the supply channel and the return channel are provided by the first and second channels, and
   the liquid coolant is able to be conducted via the cooler bar from one of the at least two semiconductor modules to another one of the at least two semiconductor modules that is additionally mounted.

4. The cooling device as recited in claim 1, wherein:
   the cooler bar arrangement includes a metal.

5. The cooling device as recited in claim 1, wherein:
   the cooler bar arrangement includes at least one fixing device for securing the at least one semiconductor module.

6. The cooling device as recited in claim 1, wherein:
   the cooler bar arrangement includes bore holes for securing the at least one semiconductor module and a further element.

7. The cooling device as recited in claim 1, further comprising:
   a sealing element for sealing between channels of the at least one second channel.

8. The cooling device as recited in claim 1, wherein:
   the liquid coolant includes one of water and demineralized water.

9. The cooling device as recited in claim 1, wherein:
   the at least one semiconductor module includes at least one semiconductor power switch corresponding to one of an IGBT, a GTO, an IGCT, a MOSFET, and a bipolar transistor.

10. The cooling device as recited in claim 1, wherein the cooler bar arrangement forms a support structure by which at least one of the at least one semiconductor module is able to be interconnected, and the cooling device is able to be secured.

11. The cooling device as recited in claim 1, wherein the cooler bar arrangement includes at least one of: a structural element, an electric line, a sensor, and a control element.

12. The cooling device as recited in claim 1, wherein the at least one semiconductor module includes a plurality of semiconductor modules arranged on several sides of the cooler bar arrangement.

13. The cooling device as recited in claim 1, wherein:
   respective diameters of the at least one first channel and the at least one second channel are different depending on a flow rate of the liquid coolant.

14. The cooling device as recited in claim 1, wherein:
   the at least one semiconductor module includes at least one actively
   cooling semiconductor module.

15. The cooling device as recited in claim 1, wherein:
the at least one first channel includes a bore hole.

16. The cooling device as recited in claim 1, wherein:
the at least one first channel includes a bore hole.

17. The cooling device as recited in claim 4, wherein:
the metal includes aluminum.

18. The cooling device as recited in claim 1, wherein the at least one first channel and the at least one second channel include at least three coolant channels, and the at least one supply feed and the at least one return feed include at least two feeds and at least two returns, the at least three channels and the at least two feeds and at least two returns being arranged so that the coolant is conveyable through a first coolant channel and a first feed to a first semiconductor module, through which the coolant is conveyable via a first return to a second coolant channel and a second feed to at least a second semiconductor module, through which the coolant returns via a second return to a third coolant channel, so that the coolant flows in series through the first and at least the second semiconductor modules.

19. The cooling device as recited in claim 1, wherein the cooling bar arrangement includes a first bar having the first channel, and a second bar having the second channel, one of the bars being arranged as the supply channel and the other of the bars being arranged as the return channel.

* * * * *

UNITED STATES PATENT AND TRADEMARK OFFICE
CERTIFICATE OF CORRECTION

PATENT NO. : 6,822,865 B2
DATED : November 23, 2004
INVENTOR(S) : Dirk Balszunat et al.

It is certified that error appears in the above-identified patent and that said Letters Patent is hereby corrected as shown below:

<u>Column 7,</u>
Line 4, change "at least one first channel" to -- at least one second channel --.

Signed and Sealed this

Thirteenth Day of September, 2005

JON W. DUDAS
*Director of the United States Patent and Trademark Office*